US006459584B1

United States Patent
Kuo

(10) Patent No.: US 6,459,584 B1
(45) Date of Patent: Oct. 1, 2002

(54) FIXING FRAME FOR POSITIONING HEAT DISPENSING DEVICE OF COMPUTERS

(76) Inventor: Yung-Pin Kuo, No.55, Alley 121, Lane 175, Kuo shen Rd., Chang Hwa City (TW)

( * ) Notice: Subject to any disclaimer, the term of this patent is extended or adjusted under 35 U.S.C. 154(b) by 0 days.

(21) Appl. No.: 10/013,358

(22) Filed: Dec. 13, 2001

(51) Int. Cl.[7] .................................................. H05K 7/20
(52) U.S. Cl. ....................... 361/704; 361/707; 361/709; 361/695; 165/80.3; 174/16.3; 257/718; 257/719; 257/727
(58) Field of Search ................................. 361/704, 707, 361/709, 710, 711, 718, 719; 257/718, 719, 721, 722, 727; 174/16.1, 16.3; 165/80.3

(56) References Cited

U.S. PATENT DOCUMENTS 6,332,251 B1 * 12/2001 Ho et al. ................... 165/80.3
6,343,013 B1 * 1/2002 Chen .......................... 165/185
6,373,704 B1 * 4/2002 Chen ......................... 165/80.3
6,392,885 B1 * 5/2002 Lee et al. ................... 165/185
6,396,697 B1 * 5/2002 Chen ......................... 165/80.3

* cited by examiner

Primary Examiner—Boris Chervinsky
(74) Attorney, Agent, or Firm—Rosenberg, Klein & Lee

(57) ABSTRACT

A fixing frame of heat dispensing device for computers includes two notches defined through two opposite walls of the fixing frame and a retaining device extend from one of the two opposite walls. The fixing frame is mounted on the base with fins on the base and a fan is connected to a top of the fixing frame. A belt has a first end extends through the retaining device and a second end of the belt extending through the two notches and a slot defined between the fins. The first end of the belt is hooked with a hook on the board and the second end of the belt is engaged with another hook on the board.

3 Claims, 6 Drawing Sheets

FIXING FRAME FOR POSITIONING HEAT DISPENSING DEVICE OF COMPUTERS

FIELD OF THE INVENTION

The present invention relates to a fixing frame having two lugs extending from an outer surface thereof so as to retain a securing belt during assembling.

BACKGROUND OF THE INVENTION

A conventional heat dispensing device for computers is shown in FIGS. 1 and 2 and generally includes a base from which two groups of fins 30 extend, a slot defined between the two groups o fins 30. A fixing frame 20 is fixedly mounted onto the base by bolts 60 and two notches 210 are defined in two opposite walls 21 of the fixing frame 20. A fan 10 is connected to a top of the frame 20 by bolts 50 and located above the fins 30 so as to send heat out from the fins 30 during operation of CPU of computers. A securing belt 40 has a first end 41 with a hole 410 which is hooked on a hook 71 on a side of a slot frame 70 on the board of computers as shown in FIGS. 3A and 3B. The belt 40 extends through the notches 210 and the slot between the two groups of fins 30 and a second end 42 of the belt 40 has another hole 420 which is to be hooked to another hook 72 on the other side of the slot frame 70. However, during assembling, the assembler has to press the first end 41 of the belt 40 to keep the first end 41 hooking to the hook 71. A tool is used to press a protrusion 43 on the belt 40 and to guide the hole 420 in the second end 42 of the belt 40 to be hooked with the hook 72. It takes a lot of time to hook the two hooks 71, 72 with the two holes 410, 420. The first end 41 could disengage from the hook 71 during assembling and/or by an impact.

SUMMARY OF THE INVENTION

In accordance with one aspect of the present invention, there is provided a heat dispensing device for computers and the device comprises a base with fins extending therefrom and a slot is defined between the fins. A fixing frame is mounted on the base and two notches are defined through two opposite walls of the fixing frame. A retaining device extends from one of the two opposite walls. A fan is fixed to a top of the fixing frame and located above the fins. A belt extending through the two notches and the slot has a first end and a second end. A section adjacent the first end of the belt is retained in the retaining device and the first end is engaged with a hook on a board. The second end of the belt is engaged with another hook on the board.

The primary object of the present invention is to provide a retaining device on the fixing frame so as to retain the first end of the belt such that the first end of the belt is well positioned during assembling.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENTS

Figure 1:
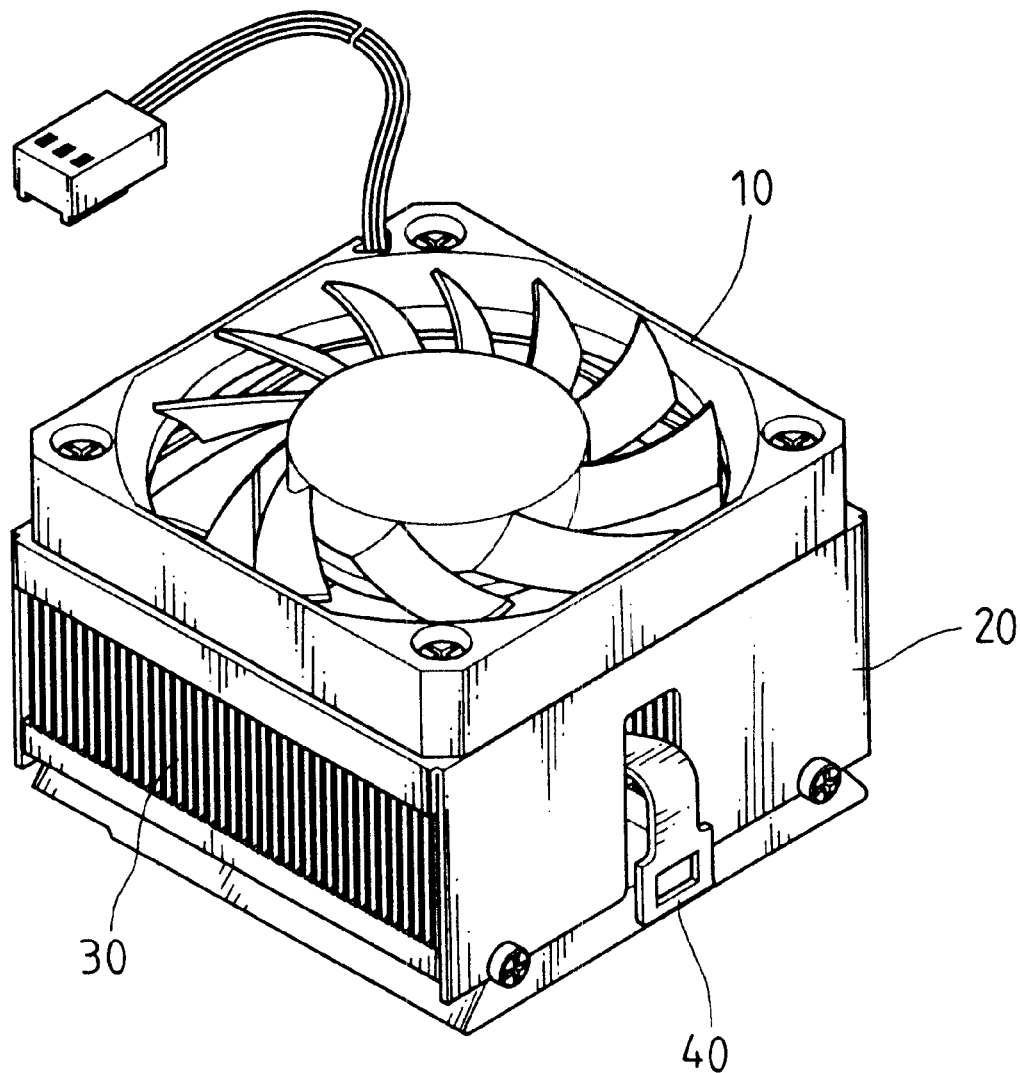
FIG. 1 is a perspective view to show a conventional heat dispensing device for computers.
Figure 2:
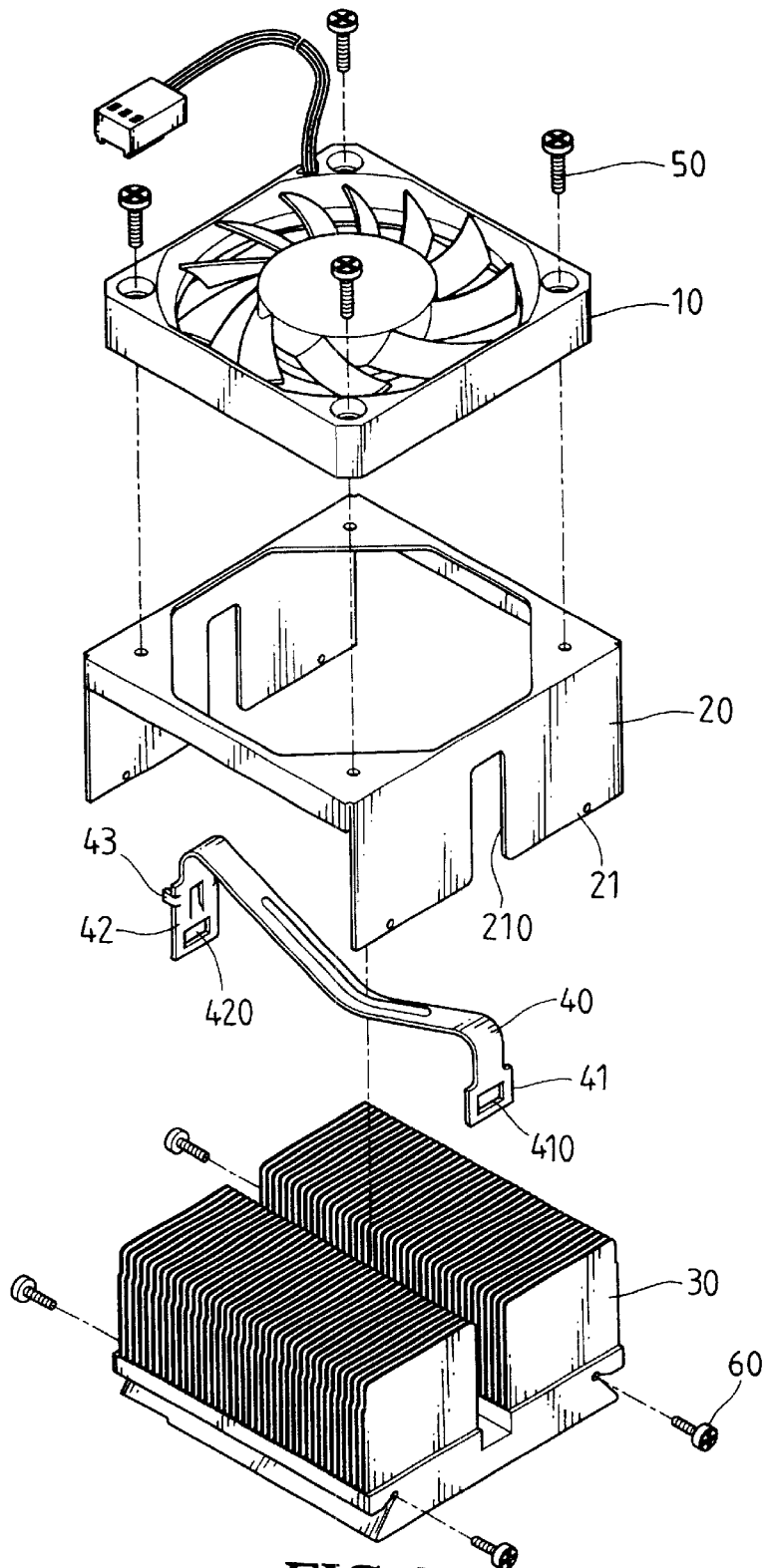
FIG. 2 is an exploded view to show the conventional heat dispensing device for computers as shown in FIG. 1.
Figure 3A:
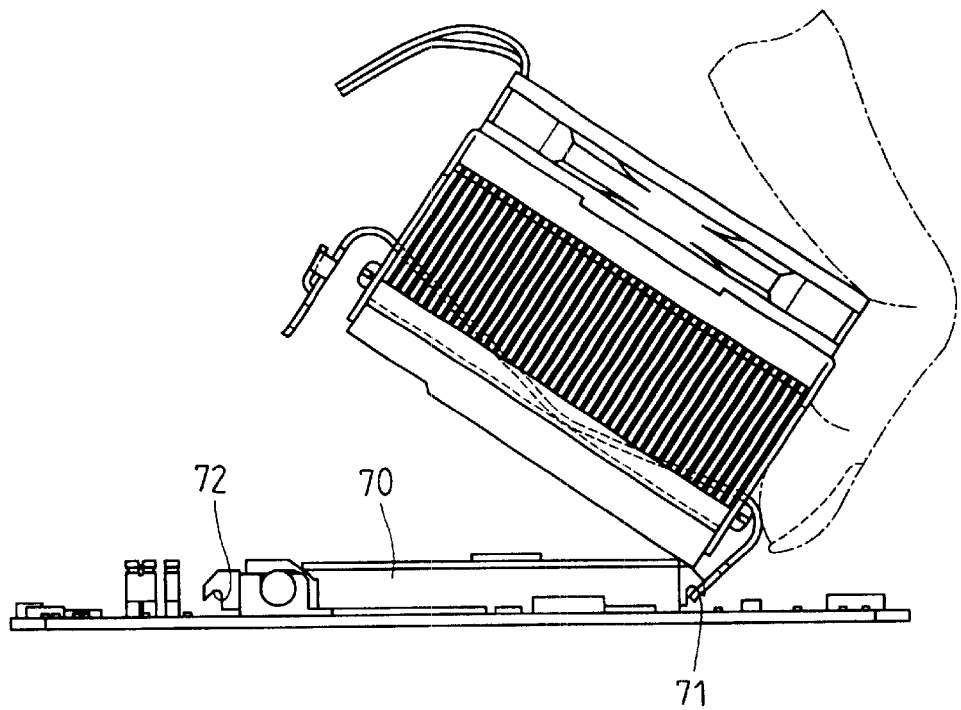
FIGS. 3A and 3B show the procedures of installing the conventional heat dispensing device onto a board.
Figure 3B:
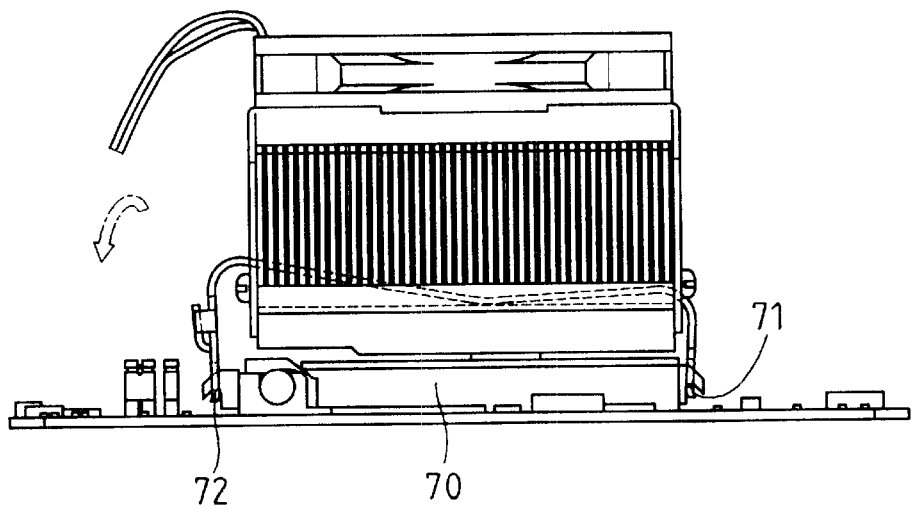
Figure 4:
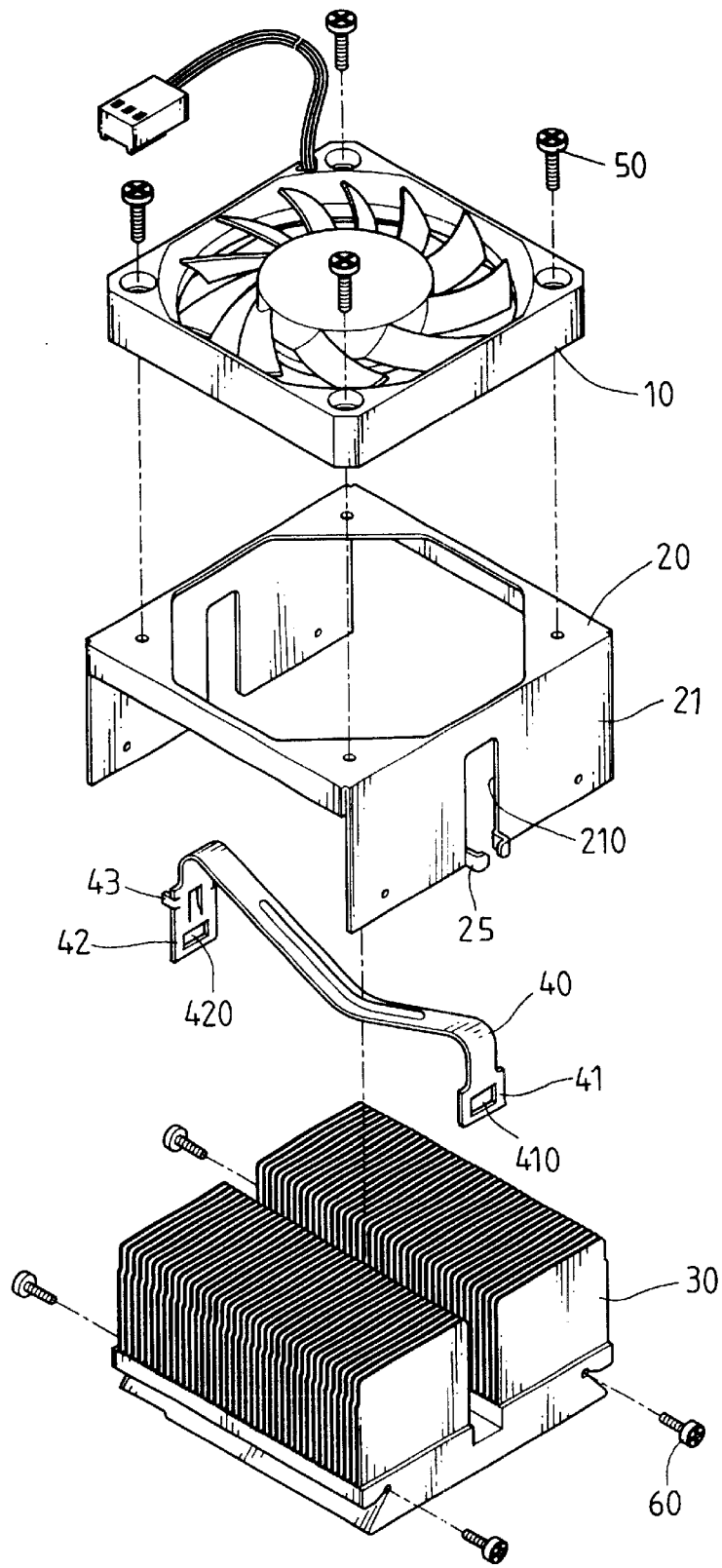
FIG. 4 is an exploded view to show the heat dispensing device for computers of the present invention.
Figure 6:
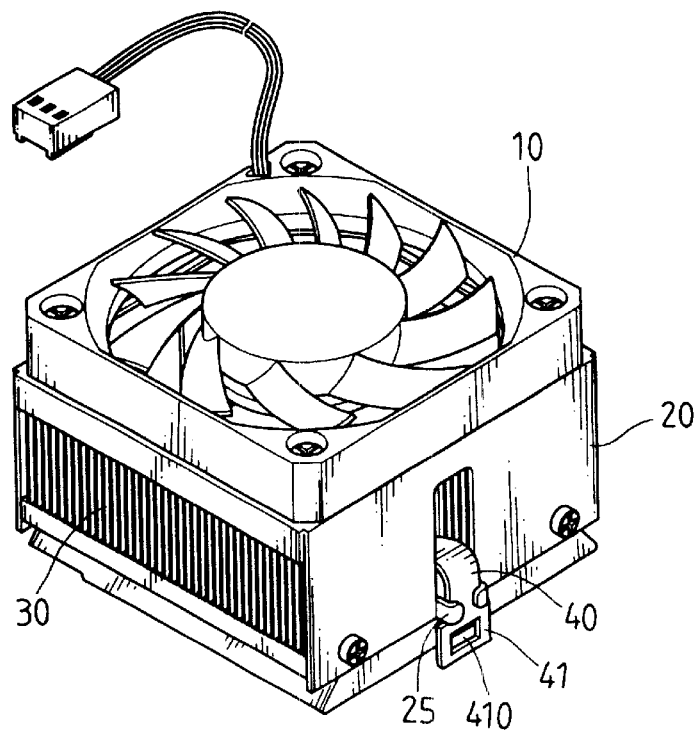
FIG. 6 is a perspective view to show the heat dispensing device of the present invention.

Referring to FIGS. 4 and 6, the heat dispensing device for computers of the present invention comprises a base with two groups of fins 30 extending therefrom and a slot is defined between the two groups of fins 30.

A fixing frame 20 is fixedly mounted on the base by bolts 60 and two notches 210 are defined through two opposite walls 21 of the fixing frame 20. A retaining device extend from one of the two opposite walls 21 and includes two lugs 25 between which a gap is defined. The notch 210 communicates with the retaining device.

A fan 10 is fixed to a top of the fixing frame 20 by bolts 50 and located above the fins 30 so as to dispense heat from the fins 30.

A belt 40 has a first end 41 and a second end 42. The belt 40 extends through the two notches 210 and the slot. A section adjacent the first end 41 of the belt 40 is retained between the two lugs 25 of the retaining device and the gap between the two lugs 25 is smaller than the belt 40.

Figure 5A:
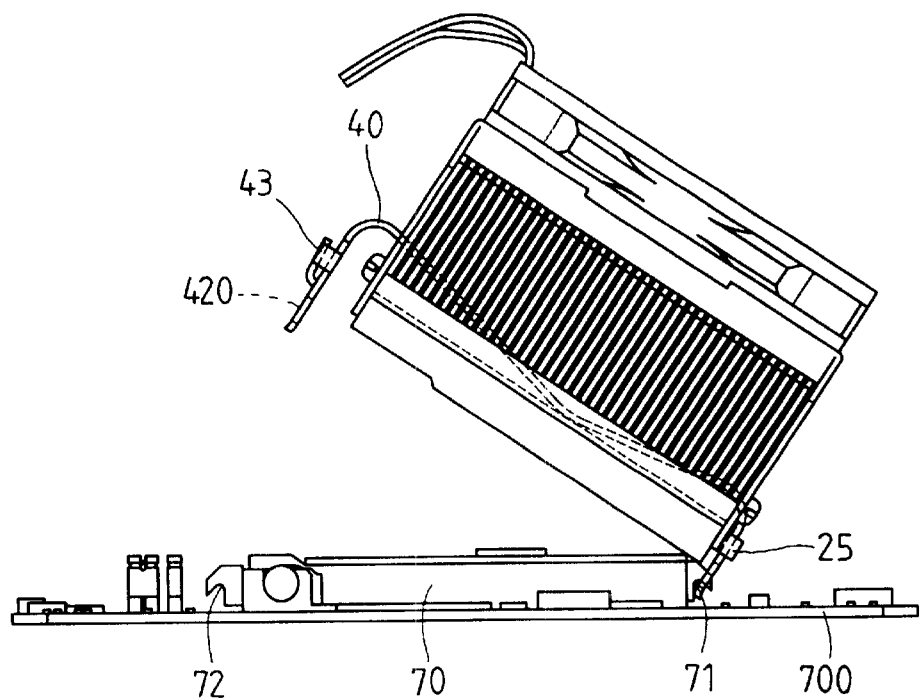
FIGS. 5A and 5B show the procedures of installing the heat dispensing device of the present invention onto a board.
Figure 5B:
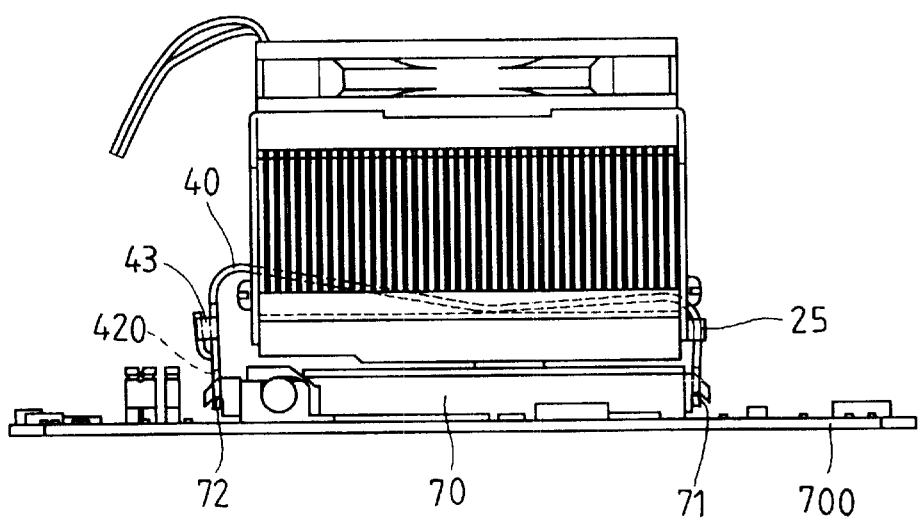

Referring to FIGS. 5A and 5B, the base is connected to a CPU slot frame 70 by first engaging a hole 410 defined in the first end 41 of the belt 40 with a hook 71 on a board 700. The second end 42 of the belt 40 has another hole 420 which is engaged with another hook 72 on the board 700. Because the first end 41 of the belt 40 is well positioned during the first step of assembling, the assembler can easily use a tool to press a protrusion 43 on the second end 42 of the belt 40 to guide the hole 420 to be engaged with the hook 72 on the board 700.

Figure 7:
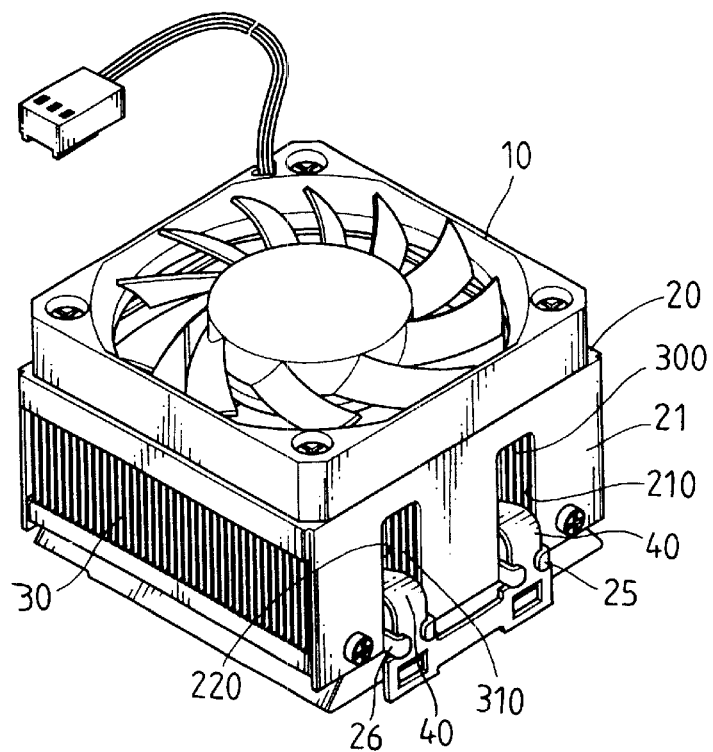
FIG. 7 is a perspective view to show another embodiment of the heat dispensing device of the present invention.

FIG. 7 shows the two opposite walls 21 of the fixing frame 20 each have two notches 210, 220 and two pairs of lugs 25, 26 are located in correspondence with each of the two notches 210, 220 in the wall 21 so that two belts 40 can be used to fix at least three groups of fins 30, 300 and 310.

While we have shown and described the embodiment in accordance with the present invention, it should be clear to those skilled in the art that further embodiments may be made without departing from the scope of the present invention.

What is claimed is:

1. A heat dispensing device for computers, comprising:
   a base with fins extending therefrom, a slot defined between said fins;
   a fixing frame mounted on said base and two notches defined through two opposite walls of said fixing frame, a retaining device extending from one of said two opposite walls;

a fan fixed to a top of said fixing frame and located above said fins, and a belt having a first end and a second end, said belt extending through said two notches and said slot, a section adjacent said first end of said belt being retained in said retaining device and said first end of said belt adapted to be engaged with a hook on a board, said second end of said belt adapted to be engaged with another hook on the board.

2. The device as claimed in claim 1, wherein said notch communicates with said retaining device.

3. The device as claimed in claim 2, wherein said retaining device includes two lugs between which a gap is defined, said gap being smaller than said belt.

* * * * *